United States Patent [19]

Nagao et al.

[11] 4,140,545
[45] Feb. 20, 1979

[54] PLURAL SOLAR CELL ARRANGEMENT INCLUDING TRANSPARENT INTERCONNECTORS

[75] Inventors: Hisao Nagao; Koichi Kawamura, both of Nara, Japan

[73] Assignee: Sharp Kabushiki Kaisha, Osaka, Japan

[21] Appl. No.: 890,800

[22] Filed: Mar. 27, 1978

Related U.S. Application Data

[63] Continuation of Ser. No. 751,547, Dec. 16, 1976, abandoned.

[30] Foreign Application Priority Data

Dec. 18, 1975 [JP] Japan .................................. 50-172246

[51] Int. Cl.² ............................................ H01L 31/06
[52] U.S. Cl. .............................. 136/89 P; 136/89 CC
[58] Field of Search ............. 136/89 P, 89 PC, 89 CC

[56] References Cited

U.S. PATENT DOCUMENTS

| | | | |
|---|---|---|---|
| 2,428,537 | 10/1947 | Veszi et al. | 136/89 |
| 3,359,137 | 12/1967 | Kaye et al. | 136/89 |
| 3,527,619 | 9/1970 | Miley | 136/89 |
| 3,616,528 | 11/1971 | Paine | 29/572 |

Primary Examiner—John H. Mack
Assistant Examiner—Aaron Weisstuch
Attorney, Agent, or Firm—Birch, Stewart, Kolasch and Birch

[57] ABSTRACT

A plurality of solar cell elements are arranged on a supporting substrate. Each solar cell element has a light receiving surface, where electrodes are formed which are connected to the P-type region and the N-type region contained within the solar cell element, respectively. The electrodes formed on the light receiving surfaces of the plural solar cell elements are electrically connected to each other by light transmitting, electrically conductive wiring means formed on the light receiving surfaces, thereby developing electric energy.

4 Claims, 6 Drawing Figures

PLURAL SOLAR CELL ARRANGEMENT INCLUDING TRANSPARENT INTERCONNECTORS

This application is a continuation, of copending application Ser. No. 751,547, filed on Dec. 16, 1976, now abandoned.

BACKGROUND AND SUMMARY OF THE INVENTION

The present invention relates to the arrangement of a plurality of solar cell elements on a supporting substrate.

Recently, some kinds of electronic apparatus such as electronic wristwatches have been developed wherein solar cells are employed as power supply means.

The electronic energy generated from a solar cell device will increase when the size of a light receiving surface of the solar cell device is increased. Therefore, it is of great importance to increase the light receiving area of the solar cell device without increasing the total size of the solar cell device.

Accordingly, an object of the present invention is to enhance the opto-electric converting efficiency of a solar cell device including a plurality of solar cell elements.

Another object of the present invention is to provide a novel arrangement of a plurality of solar cell elements for enhancing the opto-electric converting efficiency with a minimum package size.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a plurality of solar cell elements are arranged on a supporting substrate. Each solar cell element has a light receiving surface, where electrodes are formed which are connected to a P-type region and an N-type region contained within the solar cell element, respectively. The electrodes formed on the light receiving surfaces of the plurality of solar cell elements arranged on the supporting substrate are electrically connected to each other via light transmitting, electrically conductive wiring means formed on the light receiving surfaces, thereby developing electric energy.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Referring now in detail to the drawings, and to facilitate a more complete understanding of the present invention, examples of solar cell arrangements of the prior art will be first described with reference to FIGS. 1 and 2.

Figure 1:
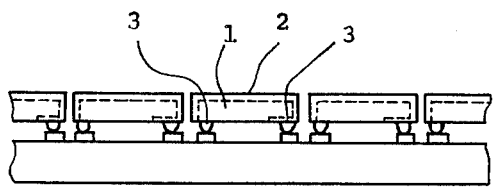
FIG. 1 is a side view showing an example of a solar cell arrangement of the prior art.

In one example of a solar cell device of the prior art shown in FIG. 1, solar cell elements of the following construction are arranged on a supporting substrate. A P-type layer 2 is formed on an N-type silicon substrate 1 in such a manner as to cover the surface of the N-type silicon substrate 1. The P-type layer 2 is formed to extend to a portion of the rear surface of the N-type silicon substrate 1, whereby two electrodes 3 are formed on the rear surface of the solar cell element, the electrodes 3 being connected to the P-type layer 2 and the N-type silicon substrate 1, respectively.

This particular solar cell device is very effective, because the whole upper surface of the solar cell element can be used as a light receiving surface contributing to the opto-electric conversion. However, the fabrication of this particular solar cell element is very complicated and troublesome, since the P-type layer must be formed to extend to the rear surface of the solar cell element.

Figure 2:
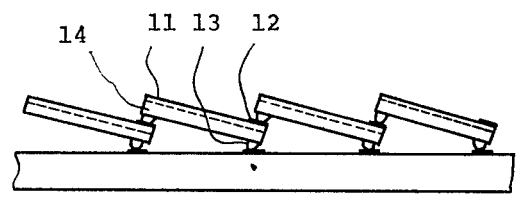
FIG. 2 is a side view showing another example of a solar cell arrangement of the prior art.

In another example of a solar cell device of the prior art shown in FIG. 2, an electrode 12 connected to a P-type layer 11 is formed on the upper surface of the solar cell element, and other electrodes 13 connected to an N-type silicon substrate 14 are formed on the rear surface of the solar cell element. A plurality of thus constructed solar cell elements are arranged on a substrate in such a manner that one of the electrodes 13 formed on the rear surface of the solar cell element is placed on the electrode 12 formed on the upper surface of the adjacent solar cell element. That is, one end of the solar cell element is piled on the confronting end of the adjacent solar cell element.

The above constructed solar cell device is not effective because the light receiving surface contributing to the opto-electric conversion is unavoidably reduced. Moreover, the solar cell device becomes thicker because the solar cell elements are inclined with respect to the supporting substrate.

Figure 3:
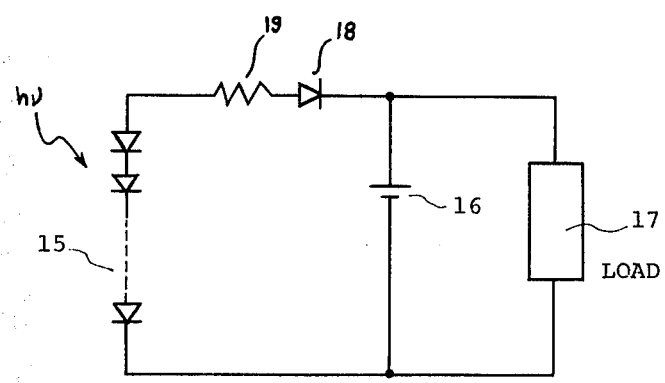
FIG. 3 is a typical circuit diagram of power supply means including a solar cell device.

Generally, the solar cell device is incorporated into power supply means in such a manner as shown in FIG. 3. A solar cell device 15 is connected to a rechargeable battery 16 in a parallel fashion. The electric energy generated by the solar cell device 15 is applied to a load circuit 17, and the superfluous energy is applied to the rechargeable battery 16 to charge it. When ambient light is not applied to the solar cell device 15, the load circuit 17 is energized by the rechargeable battery 16. The output voltage of the solar cell device 15 must be higher than that of the rechargeable battery 16 in order to energize the load circuit 17 by the output voltage of the solar cell device 15. Therefore, the solar cell device 15 includes a plurality of solar cell elements connected to each other in a series fashion. Diode 18 prevents reverse flow of current from battery 16 to solar cells 15.

Resistor 19 represents inherent resistance within the circuit elements.

Figure 4:
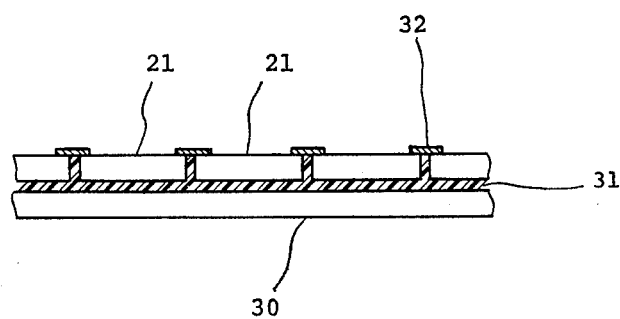
FIG. 4 is a sectional view of an embodiment of solar cell arrangement of the present invention.
Figure 5:
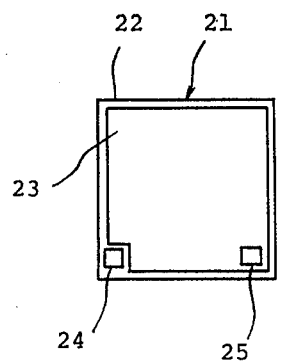
FIG. 5 is a plan view of an embodiment of a solar cell element included within the solar cell arrangement of FIG. 4.
Figure 6:
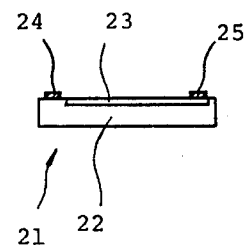
FIG. 6 is a sectional view of the solar cell element of FIG. 5.

FIG. 4 is a sectional view of an embodiment of a solar cell device of the present invention, which includes a plurality of solar cell elements 21 constructed in such a manner as shown in FIGS. 5 and 6.

The solar cell element 21 includes an N-type silicon substrate 22 and a P-type layer 23 doped with P-type impurities. The P-type layer 23 is formed so as to cover the surface of the N-type silicon substrate 22 except a portion of the surface of the N-type silicon substrate 22 through the use of diffusion technique, thereby forming the P-N junction. An electrode 24 is formed on the N-type silicon substrate 22 where the P-type layer 23 is not formed. Another electrode 25 is formed on the P-type layer 23.

The configuration of the solar cell element and the P-type diffusion layer is determined by taking account on the arrangement of plural solar cell elements on a supporting substrate. In the foregoing embodiment, the solar cell element has a square shape, and the electrodes 24 and 25 are formed at the corners of the square shaped solar cell element. That is, the electrode 24 connected to the N-type silicon substrate 22, and the electrode 25 connected to the P-type diffusion layer 23 are formed on the upper surface of the solar cell element 21 which is the light receiving surface.

A plurality of above constructed solar cell elements 21 are arranged on a support substrate 30, which also supports electronic components of, for example, an electronic wristwatch, and fixed to the substrate 30 through the use of adhesive 31 as shown in FIG. 4. The required number of the solar cell elements 21 is determined by the output level required by the load circuit. Needless to say, the respective solar cell elements 21 are arranged so that the light receiving surface thereof is directed upward. The electrodes 24 and 25 of the adjacent solar cell elements are electrically connected to each other via wiring means 32 provided on the solar cell elements 21. The wiring means 32 is made of light transmitting and electrically conductive material so as not to disturb the light exposure onto the light receiving surface of the solar cell elements.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A solar cell device comprising:
   a. a supporting base;
   b. A plurality of solar cell elements fixed to the supporting base by an adhesive, each solar cell element including:
      $b_1$ a substrate of a first conductivity type;
      $b_2$ a layer of opposite conductivity type to that of the substrate, which is formed on a substantial portion of the surface of the substrate, said surface acting as a light receiving surface;
      $b_3$ a first electrode means formed on the light receiving surface and connected to the substrate;
      $b_4$ a second electrode means formed on the light receiving surface and connected to said layer; and
   c. wiring means of a light transmitting, electrically conductive material being provided on the solar cell elements covering a portion of said light receiving surface for providing electrical communication between the electrodes formed on the light receiving surface of the respective solar cell elements, whereby said light receiving surface is able to receive impinging light through said light transmitting electrically conductive materials.

2. The solar cell device of claim 1, wherein the substrate is made of an N-type silicon substrate.

3. The solar cell device of claim 2, wherein the layer is doped with P-type impurities through the use of diffusion technique.

4. The solar cell device of claim 1, wherein the solar cell element is shaped square, and the electrodes are formed at the corners of the square shaped solar cell element.

* * * * *